United States Patent [19]

Sasatani

[11] 4,333,061
[45] Jun. 1, 1982

[54] TERRACED SUBSTRATE SEMICONDUCTOR LASER

[75] Inventor: Yukihiro Sasatani, Osaka, Japan

[73] Assignee: Sumitomo Electric Industries, Ltd., Osaka, Japan

[21] Appl. No.: 151,851

[22] Filed: May 21, 1980

[30] Foreign Application Priority Data

May 30, 1979 [JP] Japan .................................. 54-67307

[51] Int. Cl.³ .............................................. H01S 3/19
[52] U.S. Cl. ................................................... 372/46
[58] Field of Search ..................... 331/94.5 H; 357/17, 357/18

[56] References Cited

U.S. PATENT DOCUMENTS 4,296,387 10/1981 Sugino et al. .................. 331/94.5 H Primary Examiner—James W. Davis
Attorney, Agent, or Firm—Sughrue, Mion, Zinn, Macpeak and Seas

[57] ABSTRACT

A light emitting semiconductor device having a double hetero junction structure in which oscillation in a single lateral mode is stably effected. A stair-shaped step part is formed in a stripe shape upon the surface of a substrate. A current blocking layer of an opposite conductivity type is formed over the semiconductor substrate with a thickness such that the current blocking layer is interrupted along the upper edge of the stair-shaped step part to form a break area therein which acts as a current concentration region. Over the current blocking layer and break area are formed a lower clad layer, an active layer, an upper clad layer, and an ohmic contact layer.

4 Claims, 5 Drawing Figures

TERRACED SUBSTRATE SEMICONDUCTOR LASER

BACKGROUND OF THE INVENTION

The present invention relates to a light emitting semiconductor device having a stripe type double hetero structure which is capable of performing oscillation in a single lateral mode.

In a double hetero structure light emitting semiconductor device, an active layer capable of performing laser oscillation is interposed between clad layers which have a larger forbidden band width and smaller refractive index than the active layer. In such a semiconductor device, the light emitted can be confined satisfactorily in a direction perpendicular to the plane of the active layer because of the presence of the clad layers. That is, the semiconductor device can operate in a single mode. However, in the lateral direction, that is, the direction parallel to the plane of the active layer, there is no structure to confine the light and therefore the operation in the lateral mode of the semiconductor device cannot be unified. In view of this, a variety of light emitting semiconductor device having different stripe structures have been proposed in the art for preventing the diffusion of light in the direction of the semiconductor junction and to thereby unify the operation in the lateral mode.

FIGS. 1 through 3 are sectional views showing examples of conventional stripe type double hetero structure light emitting semiconductor devices. In these figures, reference numeral 10 designates an n-GaAs substrate, 11 an n-GaAlAs clad layer, 12 a p- or n-type GaAs active layer, 13 a p-GaAlAs clad layer, 14 a p-GaAs ohmic contact layer, 15 a p-side electrode, 16 an n-side electrode, 17 a p++ diffusion region, 18 a p-GaAlAs layer, and 19 an oxide insulating layer.

The example illustrated in FIG. 1 is a light emitting semiconductor device of a so-called "oxide-defined stripe" type in which the p-side electrode 15 is in the form of a stripe. The device is relatively simple in structure. The distance between the active layer 12 and the p-side electrode 15 is 4 to 6 $\mu$m. Unfortunately, if the width of the stripe-shaped electrode is set to less than 10 $\mu$m, it is difficult to sufficiently concentrate the current in the active layer 12 and the operation in the lateral direction is liable to be unstable which is a definite drawback of the example of FIG. 1.

Shown in FIG. 2 is a so-called "diffusion stripe" type light emitting semiconductor device in which Zn, for instance, is diffused to near the junction surface of the active layer 12 and the clad layer 11 to form a high density p-type diffusion region 17. This semiconductor device is superior in its heat radiating characteristic to the device shown in FIG. 1. However, it is still disadvantageous in that it is difficult to control the depth of diffusion and its operational characteristics are lowered because of defects attributed to crystalline irregularities due to the high density impurity diffusion. Furthermore, the diffusion is effected in the lateral direction to substantially the same distance as the depth of diffusion making it difficult to form a stripe-type diffusion region 17 small in width.

The structure of the light emitting semiconductor device shown in FIG. 3 is of a buried stripe type. The manufacturing of such a device includes no diffusion step. However, the device is disadvantageous in the following points. Outside a multi-layer structure which has a stripe-shaped and which was formed by mesa-etching, the p-GaAlAs layer 18 is again grown by epitaxial growth. Thus, it is necessary to carry out epitaxial growth twice during which the interface between the active layer 12 and the p-GaAlAs layer 18 is exposed to the atmosphere. Thus, the device is liable to become defective from the interface thus exposed. In addition, it is difficult to form a multi-layer structure in the form of a stripe sufficiently small in width with mesa-etching techniques.

As is clear from the above description, conventional stripe type double hetero structure light emitting semiconductor devices have a variety of drawbacks in structure and manufacture and are often not satisfactory in performance.

SUMMARY OF THE INVENTION

Accordingly, it is an object of the present invention to eliminate the above-described difficulties accompanying a conventional stripe type double hetero structure light emitting semiconductor device. A specific object of the invention is to provide a stripe type double hetero structure light emitting semiconductor device in which oscillation in a single lateral mode is stably effected in order to improve the light emitting characteristics of the device.

In accordance with the invention, the phenomenon that epitaxial growth rate becomes zero or negative at a convex part is utilized so that a part of a current blocking layer formed between a semiconductor substrate and a lower clad layer is cut or interrupted by one end portion, namely the upper edge, of a stair-shaped step part formed on the main surface of the substrate so as to form a break area in the current blocking layer in the form of a stripe. Current is concentrated in the break area thus formed so that the laser oscillation is confirmed to a small region in the active layer.

DESCRIPTION OF THE PREFERRED EMBODIMENTS

The preferred embodiments of the invention will be described below with reference to FIGS. 4 and 5 of the drawings.

Figure 1:
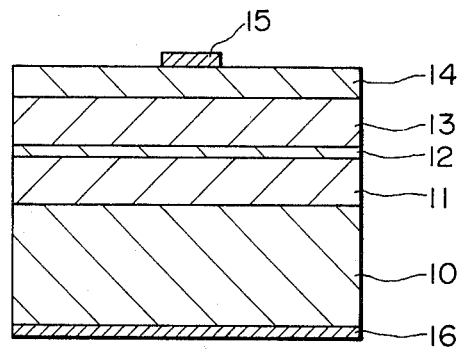
FIGS. 1 through 3 are sectional views showing examples of a conventional stripe type double hetero structure light emitting semiconductor device.
Figure 2:
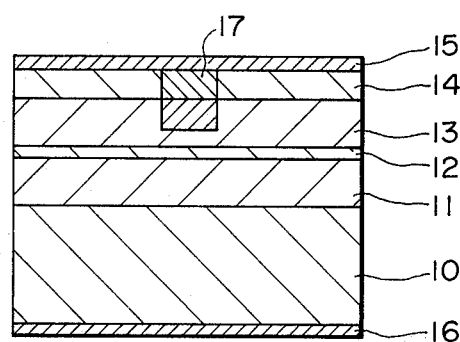
Figure 3:
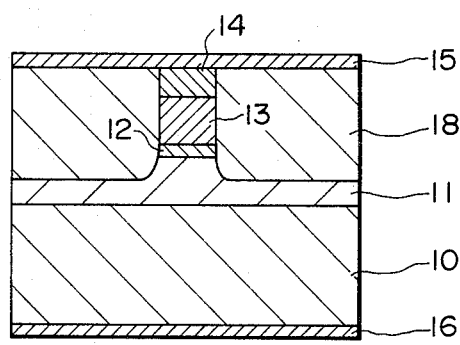
Figure 4:
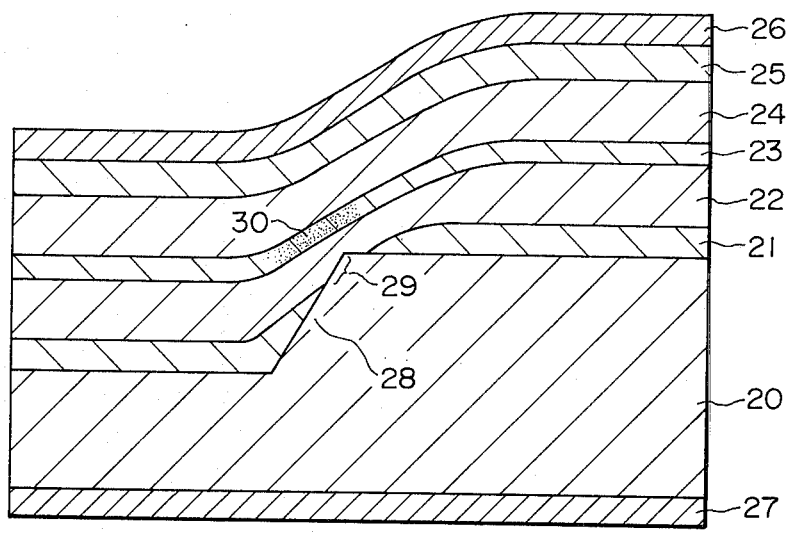
FIGS. 4 and 5 are sectional views showing examples of a light emitting semiconductor device of the invention.

FIG. 4 is a sectional view of a light emitting semiconductor device constructed in accordance with the present invention. In FIG. 4, reference numeral 20 designates an n-GaAs substrate, 21 a p-Ga$_{1-x}$Al$_x$As current blocking layer, 22 an n-Ga$_{1-x}$Al$_x$As clad layer, 23 an n-type of p-type GaAs active layer, 24 a p-Ga$_{1-x}$Al$_x$As clad layer, 25 a p-GaAs ohmic contact layer, 26 a p-side electrode, 27 an n-side electrode, 28 a stair-shaped step part, 29 a break area, and 30 a light emitting region.

In this light emitting semiconductor device, as shown in FIG. 4, the stair-shaped step part 28 is formed on the n-GaAs substrate 20 in the form of a stripe extending perpendicularly to the plane of the drawing. The p-Ga$_{1-x}$Al$_x$As current blocking layer 21 is formed over the entire surface of the n-GaAs substrate 20 with the break area 29 occurring in the form of a stripe at the end of the stair-shaped step part 28. The n-$Ga_{1-x}Al_xAs$ clad layer 22, the n- or p-type GaAs active layer 23, the p-$Ga_{1-x}Al_xAs$ clad layer 24 and the p-GaAs ohmic contact layer 25 are formed on the current blocking layer 21 in the stated order. The p-side electrode 26 is formed on the ohmic contact layer 25 and the n-side electrode 27 is formed on the other surface of the substrate 20. The stair-shaped step part 28 preferably has a height of more than 3 μm. The thickness of the current blocking layer 21 is less than one-fourth of the height of the current blocking layer 21 at a point more than 20 μm away from of the base or skirt of the stair-shaped step part 28. Each of the lower clad layer 22, upper clad layer 24 and ohmic contact layer 25 has a preferable thickness of 2 to 3 μm. The thickness of the active layer 23 is preferably 0.5 to 1 μm. If the forbidden band widths and refractive indices of the lower clad layer 22, active layer 23 and upper clad layer 24 are represented by $Eg_2$, $Eg_3$, and $Eg_4$ and $N_2$, $N_3$, and $N_4$, respectively, then $Eg_3 < Eg_2$, $Eg_3 < Eg_4$, and $N_3 > N_2$, $N_3 > N_4$.

When positive and negative voltages are applied to the p-side electrode 26 and the n-side electrode 27 of the light emitting semiconductor device thus formed, the PN junction formed between the p-$Ga_{1-x}Al_xAs$ current blocking layer 21 and the n-$Ga_{1-x}Al_xAs$ clad layer 22 is reversely biased and therefore current is allowed to flow collectively at the break area 29. As a result, the light emitting region is limited to a region of small width as indicated by reference numeral 30. The light emitting region 30 operates in an equivalent manner to a structure in which a portion perpendicular to the direction of the stripe is surrounded by clad layers each having a forbidden band width larger than that of the active layer and a refractive index smaller than that of the active layer. Therefore, with the structure of the invention, the light emitting semiconductor current and light are both confined as a result of which the device operated stably in both a lateral mode and in a single fundamental mode.

An example of a method of manufacturing a light emitting semiconductor device having the structure described above will be given. First, the n-GaAs substrate 20 is etched with a mask provided on one side of the upper surface of the substrate 20 so as to form the stair-shaped step part 21 which extends in the form of a stripe in one direction to a height of about 3 to 10 μm. The etching liquid may, for example, be a mixture solution of $H_3PO_4$ and $H_2O_2$. The height of the step part 28 can be determined as desired by controlling the etching time. If the main surface of the n-GaAs substrate 20 is in the (100) plane and the direction of the stripe is selected to be the <011> direction, then a surface in the (111) plane is exposed.

Next, the p-$Ga_{1-x}Al_xAs$ current blocking layer 21 is formed on the n-GaAs substrate 20 by a liquid-phase epitaxial growth method so that the thickness of the current blocking layer 21 more than 20 μm away from the skirt of the stair-shaped step part 28 is less than one-fourth of the height of the step part 28. Since the epitaxial growth rate becomes zero or negative in the region of convex parts, the current blocking layer 21 is not formed at the stair-shaped step part 28 thus forming the break area 29 which serves as the current concentration region.

The n-$Ga_{1-x}Al_xAs$ clad layer 22 with a thickness of 2 to 3 μm, the n- or p-type GaAs active layer 23 with a thickness of 0.5 to 1 μm, the p-$Ga_{1-x}Al_xAs$ 24 with a thickness of 2 to 3 μm, and the p-GaAs ohmic contact layer 25 with a thickness of 2 to 3 μm are formed on the upper surface of the current blocking layer 21 using a liquid epitaxial growth method in the stated order. Finally, the p-side electrode 26 is formed on the ohmic contact layer 25 and the n-side electrode 27 is formed on the bottom of the substrate 20. The thickness of the n-$Ga_{1-x}Al_xAs$ clad layer 22 should be so selected that no break area is formed therein.

A specific example of a light emitting semiconductor device constructed in accordance with the invention will be given. With the main surface of the substrate 20 in the (100) plane, the height of the stair-shaped step part 28 is selected to be 6 μm and the direction of the stripe is <011>. The angle of inclination the step part will then be about 55°. With the thickness of the p-$Ga_{1-x}Al_xAs$ current blocking layer 21 selected to be 1.5 μm at a point more than 20 μm away from the skirt of the stair-shaped step part 28, the break area 29 of the current blocking layer 21 will be formed as a stripe having a width of about 1 μm while the lateral width of the light emitting region 30 will be about 5 μm.

As is apparent from the above description, the layers 21 through 25 of the light emitting semiconductor device according to the invention can be formed with continuous liquid-phase epitaxial growth process. Therefore, the active layer 23 is never exposed to the atmosphere. Accordingly, the light emitting semiconductor device of the invention does not suffer from the difficulties accompanying a conventional device of this type having buried stripe structure.

While the invention has been described with respect to a light emitting semiconductor device having a double hetero junction structure of GaAlAs and GaAs, it is obvious that the technical concept of the invention can be applied to a light emitting semiconductor device having a double hetero junction structure of other multi-element compounds such as for instance InP and InGaAsP.

In the above-described example of the light emitting semiconductor device, the p-side electrode 26 is described as being formed over the entire surface of the ohmic contact layer 25. However, the p-side electrode 26 may be provided in the form of a stripe extending longitudinally of the stair-shaped step part 28. In this case, the effect of current concentration is remarkably improved.

Figure 5:
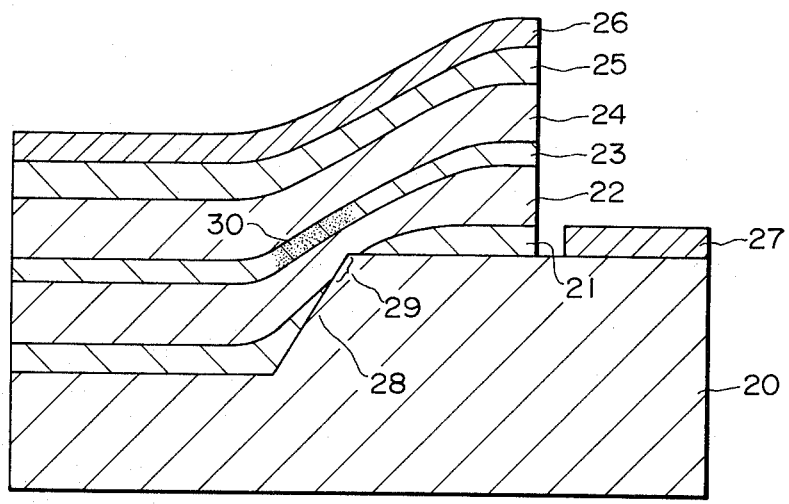

Another example of a light emitting semiconductor device is as shown in FIG. 5 in which those components which have been previously described with reference to FIG. 4 are accordingly similarly numbered. In this example, the epitaxial layers 21 through 25 at a point more than 5 μm away from the end of stair-shaped step part 28 are eliminated by etching or other process to expose the substrate 20 and the n-side electrode 27 is formed on the exposed surface of the substrate 20. With the structure thus formed, the electrodes can all be formed on one surface of the semiconductor device.

As is clear from the above description, according to the invention, the current blocking layer is of a different conductivity type than the semiconductor substrate and is formed between the lower clad layer and the semiconductor substrate with the lower clad layer being of the same conductivity type as the substrate. A portion of the current blocking layer is cut in the form of a stripe at the end of the stair-shaped step part on the main surface of the semiconductor substrate utilizing the fact that the epitaxial growth rate becomes zero or negative at convex areas. Thus, a break area in the form of a stripe having a small width is formed by forming the current blocking layer with an appropriate break therein so that current is concentrated at the break area with the surrounding PN junction providing reverse bias. Accordingly, the light emitting region thus formed is quite small. The light emitting semiconductor device of the invention has a structure equivalent to a structure in which the light emitting region is surrounded by upper and lower clad layer having a large forbidden band width and small refractive index. That is, current and light are both advantageously confined. Thus, the semiconductor device of the invention operates stably both in a lateral mode and in a single fundamental mode.

With the method of manufacturing the light emitting semiconductor device for the invention, a step of diffusion is eliminated from previously used processes and the various semiconductor layers thereof can be formed by a continuous epitaxial growth process. Accordingly, the active layer is never exposed to the atmospheric and therefore the characteristics of the device are stably maintained.

What is claimed is:

1. In a semiconductor laser, a light emitting semiconductor device having a double hetero junction structure comprising: a semiconductor substrate of a first conductivity type; a stair-shaped step part in the form of a stripe on a surface of said substrate; a current blocking layer of a second conductivity type formed as a surface of said semiconductor substrate, said current blocking layer being interrupted along an edge portion of said stair-shaped part to form a break area in said current blocking layer in the form of a stripe, said break area forming a current concentration region; and a lower clad layer of said first conductivity type, an active layer of one of said first and second conductivity types, and an upper clad layer of said second conductivity type formed on said current blocking layer and said break area in the stated order.

2. The light emitting semiconductor device of claim 1 wherein said substrate comprises n-GaAs, said current blocking layer comprises $p\text{-}Ga_{1-x}Al_xAs$, said lower clad layer comprises $n\text{-}Ga_{1-x}Al_xAs$, said active layer comprises GaAs, and said upper clad layer comprises $p\text{-}Ga_{1-x}Al_xAs$.

3. The light emitting semiconductor device of either claim 1 or 2 wherein the height of said stair-shaped step part is in the range of 3–10 μm and the height of said current blocking layer has a thickness of less than one-fourth of the height of said substrate at a position at least 20 μm from the base of said stair-shaped step part.

4. The light emitting semiconductor device of either claim 1 or 2 wherein the height of said stair-shaped step part is in the range of 3–10 μm and the height of said current blocking layer has a thickness of less than one-fourth of the height of said substrate, said lower clad layer has a thickness in the range of 2–3 μm, said active layer has a thickness in the range of 0.5–1 μm and said upper clad layer has a thickness in the range of 2–3 μm at a position at least 20 μm from the base of said stair-shaped step part.

* * * * *